United States Patent [19]

Heremans et al.

[11] Patent Number: 4,926,226
[45] Date of Patent: May 15, 1990

[54] MAGNETIC FIELD SENSORS

[75] Inventors: Joseph P. Heremans, Troy; Dale L. Partin, Sterling Heights, both of Mich.

[73] Assignee: General Motors Corporation, Detroit, Mich.

[21] Appl. No.: 240,778

[22] Filed: Sep. 6, 1988

[51] Int. Cl.$^5$ .................... H01L 27/12; H01L 27/22; H01L 29/06
[52] U.S. Cl. .......................... 357/27; 357/4; 357/20; 357/55
[58] Field of Search .................. 357/4, 20, 27, 55

[56] References Cited

U.S. PATENT DOCUMENTS 4,754,310  6/1988  Coe ................................. 357/20
4,793,872 12/1988  Meunier et al. ................... 357/16

OTHER PUBLICATIONS

N. J. Kawai et al., "Magnetic field-individual semimetal-to-semiconducator & Transition in In Az-Ga Sb superlattices,"*Applical Physics Letters*, 36(5) Mar. 1980 pp. 369 to 371.
G. H. Doehler, "Doping superlattices", *Journal of Vacuum Science of Technology*, 16(5) May/Jun. 1979, pp. 851 to 856.
J. C. Maan et al., "Quantum Transport in GaAc doping superlattices", of Vacuum Science & Technology B1(2) (Apr.-Jun. 1983) pp. 289-292.
O. S. Luters et al, "Sensitivity Limits on SOS Magnetodiodes", *IEEE Transactions on Electron Devices*, vol. ED-27, No. 11, pp. 2156-2157 (Nov. 1980).
M. Kimura and S. Takahashi, "Si Magnetic Sensor Composed of Two Combined PIN Diodes," *Electronics Letters*, vol. 22, No. 16, pp. 830-832 (Jul. 31, 1986).
A. Chovet et al, "Noise Limitations of Magnetodiodes," *Sensors and Actuators*, 4 (1983), pp. 147-153, based on a paper presented at Solid-State Transducers 83, Delft, the Netherlands, May 31-Jun. 3, 1983.
S. Kataoka, "Recent Development of Magnetoresistive Devices and Applications," *Circulars of the Electrotechnical Laboratory*, No. 182, UDC 621.382:537.621.2, pp. 1-52, Agency of Industrial Science and Technology, 2-Chome Nagata-Cho, Chiyoda-ku, Tokyo, Japan (Dec. 1974).
S. Kordic, "Integrated Silicon Magnetic-Field Sensors", *Sensors and Actuators*, vol. 10, Nos. 3 & 4, pp. 347-378 (Nov./Dec. 1986).
T. Yamada, "A New Highly Sensitive Magneto-resistive Effect in Semiconductors", *Proceedings of the IX International Conference on the Physics of Semiconductors*, vol. 2, Moscow, Jul. 23-29, 1968, pp. 672-675.
G. H. Dohler, "Physics and Applications of Doping Superlattices", a paper from pp. 270-284 of the book *Two-Dimensional Systems, Physics and New Devices; Proceedings of the International Winterschool, Mauternsdorf Austria, 1986*, published by Springer Verlag, Berlin 1986.
G. H. Dohler, "n-i-p-i Doping Superlattices-Metastable Semiconductors with Tunable Properties", *Journal of Vacuum Science and Technology*, B, vol. 1, No. 2, Apr.-Jun. 1983, pp. 278-284.
J. Burtscher et al, "Die Rekombination in Thyristoren Und Gleichrichtern Aus Silizium: Ihr Einfluss Auf Die Durchlasskennlinie Und Das Freiwerdezeitverhalten", *Solid-state Electronics*, vol. 18, pp. 35-63 (Pergamon Press, Great Britain, 1975).

*Primary Examiner*—J. Carroll
*Attorney, Agent, or Firm*—Robert J. Wallace

[57] ABSTRACT

A magnetodiode for use in a magnetic sensor using a semiconductive element (advantageously of a direct band-gap, high mobility material such as gallium arsenide) that has a superlattice formed by an n-i-p-i doping profile or superstructure. Such a superlattice is used to provide a region of long recombination times for the normal flow of charge carriers from which the carriers are deflected into short recombination time regions by a magnetic field being sensed.

8 Claims, 2 Drawing Sheets

MAGNETIC FIELD SENSORS

FIELD OF THE INVENTION

This invention relates to devices useful as sensors of magnetic fields.

BACKGROUND OF THE INVENTION

Presently a wide variety of magnetic field sensors are already known. Of particular interest are magnetodiode sensors of the kind that employ a semiconductive element into which are injected hole and electron charge carriers from opposite ends. The semiconductive element is made inhomogeneous so that it includes at least two regions of very different recombination times for charge carriers therein. A magnetic field to be sensed is made to traverse the semiconductive element in a specific direction. In that direction, the resulting Lorentz force deflects the charge carriers initially injected into one of the two regions into the other of the two regions. Such deflection results in a change of the amount of current flowing between the two ends of the semiconductive element. The basic principles of magnetodiode sensors of this kind are described in a paper by Kataoka entitled "Recent Developments of Magnetoresistive Devices and Applications" in circular #182 of the Electromechanical Laboratory, Agency of Industrial Science and Technology, Tokyo, Japan, Dec. 1974.

The present invention relates to a magnetodiode type of magnetic sensor that is well adapted for use as a position sensor, particularly for automotive applications, although its application is not so limited.

In a magnetic field sensor of the kind described, sensitivity depends importantly on two parameters: (1) the mobilities of the charge carriers in the semiconductive material forming the magnetodiode, and (2) the recombination time $T_R$. $T_R$ is the average time it takes for a charge carrier of one sign to recombine with a charge carrier of the opposite sign after injection of the charge carrier into the semiconductive material. Recombination occurs before the charge carrier reaches its charge collecting electrode. We do not know what specifically happens to the charge carriers when they recombine, but the result is a reduction in electrical current flow between complementary electrodes of the magnetodiode.

For high sensitivity to the effects of a magnetic field, the mobilities of the charge carrier should be high because the amount of deflection of the path of a charge carrier in the presence of a magnetic field normal to the path is proportional to the product of carrier mobility and magnetic field strength.

Also, for high sensitivity to the effects of a magnetic field, carrier recombination times should be long because the average distance a charge carrier will travel in a semiconductive material is proportional to the product of the recombination time and the drift velocity of the charge carrier.

In semiconductive materials readily available for use in sensors of the kind described, a semiconductive material such as silicon which is an indirect band-gap material, has a carrier recombination time that is attractively long. However, it has carrier mobilities that are relatively low. As indicated above, high mobilities are needed to obtain a magnetodiode having high sensitivity to a magnetic field. On the other hand, some compound semiconductors, such as GaAs, InAs, $Bi_{1-x}Sb_x$, and InSb, which are direct band-gap materials, have carrier mobilities that are attractively high. However, their carrier recombination times are normally undesirably short. Because the recombination times are short, these materials have not been as sensitive as would be liked. The present invention represents a new approach to overcome the above shortcomings of the normally short carrier recombination times in such, i.e., direct band-gap, compound semiconductors. This approach involves using these latter materials to form distinctive diode structures that exhibit considerably longer carrier recombination times than conventional diode structures.

SUMMARY OF THE INVENTION

For use in a magnetic field sensor of the kind discussed, the invention includes a semiconductive element that provides carriers of high mobility and long recombination times. To this end there is used a semiconductive element that is formed of a direct band-gap material and that has a periodic doping profile through its thickness consisting of very thin alternate n-and p-doped layers, preferably with intrinsic zones therebetween, known variously as doping superlattices or n-i-p-i superlattices.

The properties of doping superlattices have been described in detail in papers by G. H. Dohler, entitled, "n-i-p-i Doping Superlattices-Metastable Semiconductors With Tunable Properties," *Journal of Vacuum Science and Technology*, B, Vol. 1, No. 2, Apr.–June 1983, pps. 278–284, and "Physics and Applications of Doping Superlattices," a paper from pages 270–284 of the book *Two-Dimensional Systems, Physics and New Devices: Proceedings of the International Winterschool, Mauternsdorf, Austria*, 1986, published by Springer Verlag, Berlin 1986. As discussed therein, the unusual properties of doping superlattices derive from the different nature of the superlattice potential, which is the space charge potential of ionized impurities in the doping layers. The space charge potential in the doping superlattices modulates the band edges of the host material and the electrons and holes become spatially separated. The separations can be controlled by appropriate choice of the doping concentrations and the layer thicknesses. It is this latter property that is most important to this invention. The degree of confinement of carriers within their respective layers is directly related to the band-gap of the semiconductive materials forming those layers. The spatial separation of holes and electrons results in a partial compensation of the impurity space charge potential. Such spatial separation in the superlattice dramatically lengthens recombination times of carriers over the time they exhibit in bulk materials; i.e., non-superlattice structures. However, mobilities are not effectively reduced. Recombination times in the superlattice are not just slightly increased, they are increased many orders of magnitude, over that of the bulk material. For example, lifetimes can be increased from 1–10 nanoseconds to one second or more. Moreover, large excess carrier concentrations in the layers can be achieved at relatively low injection currents as compared to bulk material of the same doping concentration.

It appears that hitherto doping superlattices have been proposed primarily for electro-optic devices with an electric field established normal to the layers for current flow normal to the layers. However, the first of the two cited Dohler papers also discusses the tuning of the carrier concentration in doping superlattices by the injection of carriers selectively into the various layers via electrodes. In particular, studies were mentioned in which there were provided two spaced apart electrodes. The first spaced apart electrode provides ohmic contacts to all the n-type layers for injection of electrons therein but blocking contacts to the p-type layers. The second spaced apart electrode provides ohmic contacts to all the p-type layers for injection of holes therein but blocking contacts to all the n-type layers. Moreover, reference was made to magnetotransport experiments with the magnetic field parallel and perpendicular to the layers that established the two-dimensional character of the system. However, no magnetic device applications are suggested.

In a magnetic field sensor in accordance with the present invention, illustratively a magnetodiode, a doping superlattice having layers largely of long carrier recombination times is provided with injecting contacts at opposed surfaces for selective charge carrier injection, as just discussed, for carrier flow essentially parallel to the layers. The device is to operate under forward bias, that is, the p-type regions biased positively with respect to the n-type regions. Current flow injected into one end of a given layer will travel varying lengths of that layer and then pass through the p-n junction separating that layer from a contiguous layer and then complete its travel to the other end of the second layer. Therefore, while most current carriers travel a trajectory inside one of the layers that is essentially parallel to the major faces of the layer, some current carriers ultimately cross the p-n junctions that separate those layer major faces from major faces of contiguous layers. A magnetic field to be sensed is applied in the direction perpendicular to the layers. Hence, it is essentially perpendicular, i.e., normal to the current carrier flow within respective layers of the superlattice. The magnetic field will laterally deflect the charge carriers essentially parallel to the layer faces. In other words, carriers flowing in a given layer will be deflected transversely within that layer. Hence, they are deflected toward a side, i.e., edge, of that layer.

Each of the layers of the doping superlattice is provided with a region of short carrier recombination time on at least one side. The transverse deflection of the charge carriers in each layer moves the carriers into that region for recombination. In a p-i-n diode, at a given voltage, increasing the rate of recombination reduces the effective current flow between its complementary electrodes. Accordingly, in our device, the magnetic field can be sensed as a change in the current flow between the injecting contacts in a manner analogous to conventional magnetodiodes.

DETAILED DESCRIPTION

Figure 1:
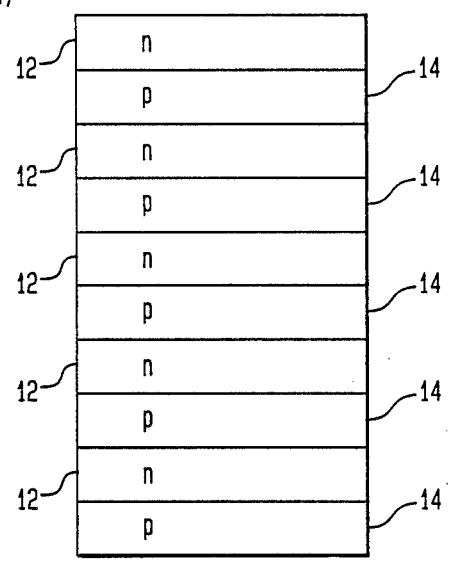
FIG. 1 schematically shows a plan view of an end of a semiconductive element in the form of a doping superlattice comprising alternate n-type and p-type layers.

With reference now to FIG. 1, the semiconductive element 11 is a doping monocrystalline superlattice structure comprised alternatively of thin monocrystalline n-type layers 12 and lattice matched thin monocrystalline p-type layers 14. It is common practice in the art to describe such a structure as an n-i-p-i superlattice even in the absence of any intentionally undoped intermediate zones between the n-type and p-type layers. This is because the electrostatic bending of the energy bands associated with such layers will effectively induce intermediate zones having insignificant concentrations of free charge carriers, and so effectively of intrinsic conductivity type. Advantageously, layers 12 and 14 of element 11 are of a direct band-gap compound semiconductor, such as gallium arsenide, indium arsenide, indium antimonide or a bismuth-antimony alloy. Such semiconductive materials are known normally in bulk to have high carrier mobilities but short carrier recombination times.

In our structure, each layer advantageously has a thickness less than the Debye length of charge carriers to be injected in the layer. Typically these layers will have thickness of between 50 and 3,000 Angstroms. For convenience of design and manufacture, we prefer to make each layer substantially of the same thickness, although this is unnecessary. The average doping concentration in each layer advantageously is between $10^{16}$ and $10^{18}$ atoms per cubic centimeter. The thinner the layers, the higher the doping concentration should be to assure enough modulation of band edges in each layer to effectively separate injected carriers. The length of each layer should be less than the diffusion length of the current carrier in the layer. More specifically, it should be a length less than $T_R$ times the drift velocity of the carrier. On the other hand, we prefer it to be long enough for effective disposition of a short recombination time region between its ends. It should also be long enough for deflection of current carriers into the short recombination time region under the strength of the magnetic fields expected to be sensed. Typically this length will be between 10 microns and 500 microns. Advantageously there will be a total of between 10 and 100 such layers in element 11, depending on the amount of output current desired, although even as few as two layers may sometimes be enough.

Various known techniques are available for providing such layers in element 11, for example, molecular beam epitaxy (MBE), chemical vapor deposition (CVD) and metal-organo chemical vapor deposition (MOCVD). Typically, the various layers will have been grown epitaxially on a suitable high resistivity monocrystalline substrate having a lattice constant as closely matching that of layers 12 and 14 as is obtainable, so that layers 12 and 14 will be substantially monocrystalline and provide high carrier mobility and recombination times.

For use in a magnetic sensor of the invention, it is essential to also provide in each of layers 12 and 14 a region in which the carriers have considerably shorter recombination times and into which the carriers may be deflected by the magnetic field being sensed. As hereinbefore mentioned, the current carriers injected into a given layer travel essentially parallel to the major surfaces of that layer until they trickle through into the contiguous layer, or layers, where they then continue to travel essentially parallel to the layer major surfaces.

This is how they get from one end of this device to the other.

A magnetic field normal to these layers will deflect the current flow parallel to the layer major faces. In this invention, such a magnetic field will cause more current carriers to pass through the region of each layer having a much higher rate of recombination than when no magnetic field is present. A greater percentage of them will thus not be able to complete their draft through or parallel to the layers 12 and 14. The measured current flow between electrodes at the ends of these layers is thus modulated directly in accordance with the strength of the magnetic field being sensed. The regions of low recombination times in these layers are desirably formed on one surface of the element, as will be discussed in connection with FIG. 2.

Figure 2:
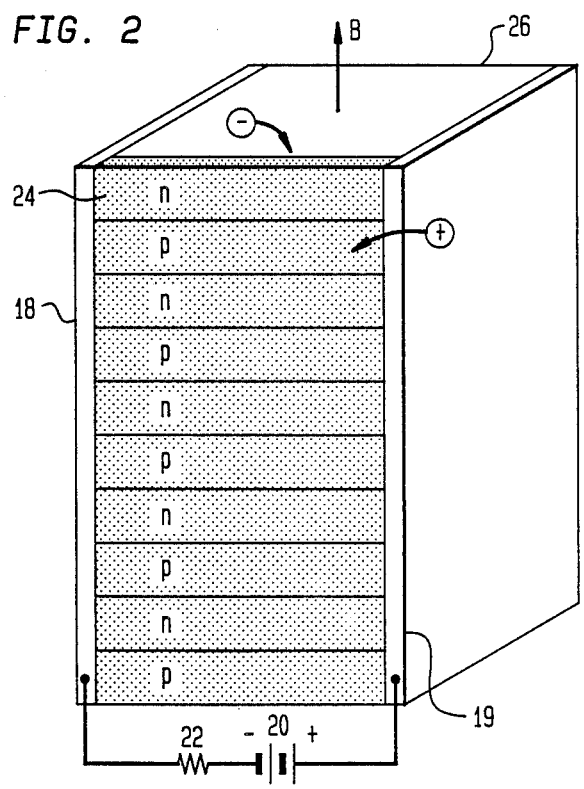
FIG. 2 schematically shows a three-dimensional view a magnetodiode sensor in accordance with an illustrative embodiment of the invention, including a semiconductive element of the kind shown in FIG. 1.

FIG. 2 schematically shows a perspective view of a semiconductive element 11 of the kind shown in FIG. 1 used in a magnetodiode that is connected in a circuit that will measure the intensity of a magnetic flux B in a direction normal to the parallel n-type and p-type layers 12 and 14 of the element.

To this end, an n-type injecting electrode 18 is provided along one face of the element to contact one end of each of the layers 12 and 14, and a p-type injecting electrode 19 is provided along the opposite face of the element to contact the opposite end of each of the layers 12 and 14. A bias voltage is applied between the opposite ends of the layers 12 and 14 by the DC voltage source 20 connected between electrodes 18 and 19 of appropriate polarity so that the electrode 18 will inject electrons selectively into the n-type layers 12 and electrode 19 will inject holes selectively into the p-type layers 14. A resistor 22 is connected in series in this circuit and the voltage thereacross monitored as a measure of the current flowing in the circuit. Even though electrode 18 is forward-biased with respect to layers 14 and so will introduce electrons therein, and electrode 19 is forward-biased with respect to n-layers 12 and so will introduce holes therein, most of the current will flow between the n-type and p-type layers 12 and 14, respectively, for two basic reasons. First, the contact area between layers 12 and 14 is much larger than the total contact area between layers 12 and electrode 19 or layers 14 and electrode 18, respectively. Additionally, the contact electrodes 18 and 19 correspond to material which is much more heavily doped than layers 12 and 14, and this raises the contact potential between electrode 18 and layers 14 and electrode 19 and layers 12, respectively. A doping concentration greater than about $10^{19}$ can be used in electrodes 18 and 19.

The injecting electrodes 18 and 19 can be readily formed simply by implanting appropriate ions to form heavily doped regions at opposite ends of the layers, in particular donor ions for electrode 18 and acceptor ions for electrode 19. The material is then generally thermally annealed to activate the implanted ions and to repair any damage caused by the implantation. It is also usual to provide metallic coatings over such electrodes to facilitate making low resistance contact to such electrodes.

The entire front face 24 of the element as seen in FIG. 2 is treated to be a region of short recombination times, denoted by the stippling. Injected electrons and holes drifting in their respective layers are deflected towards such face 24 by the Lorentz force resulting from the action of the magnetic field B. Various techniques are known for forming this face into a region of short recombination times. These techniques include inflicting damage on the crystalline structure of such surface by chemical etching, mechanical abrasion, and unannealed ion implantation.

Proton bombardment, in the case of a gallium arsenide element, is known to convert gallium arsenide into an insulator-like, i.e., high resistivity material. Moreover, it forms an interface with the implanted gallium arsenide that retains the characteristic of providing relatively long recombination times. Accordingly, proton bombardment can be used, if desired, to treat the back surface 26, opposed to surface 24, to keep such back surface of a long recombination lifetime, while isolating the active portions of the layers (those shown) from the remaining portions of the layers (not shown) of the epitaxial film, or from the environment. In such instance, electrodes 18 and 19 should not extend past surface 26 onto the remaining epitaxial film. Alternatively, if the magnetic sensor is intended to be symmetric with respect to the direction of the magnetic field B, the back surface 26 should be treated in the manner of front surface 24 so that holes and electrons deflected thereto by a magnetic field of the opposite direction will also readily recombine there.

A possible shortcoming with the design shown in FIG. 2 is that with some semiconductors of possible interest damaging the front surface 24 tends to break bonds between atoms in the surface layer and thereby tends to create a high density of low-mobility free carriers therein so that such surface 24 becomes conductive. Such a conductive surface can serve as an electrical short between contacts 18 and 19 diverting current that would otherwise pass through the bulk portion where the current is being monitored. This would reduce the sensitivity of the sensor. A possible solution to this problem is to include a damaged surface layer that is not continuous between the electrodes 18 and 19, as shown in FIGS. 3A and 3B.

Figure 3A:
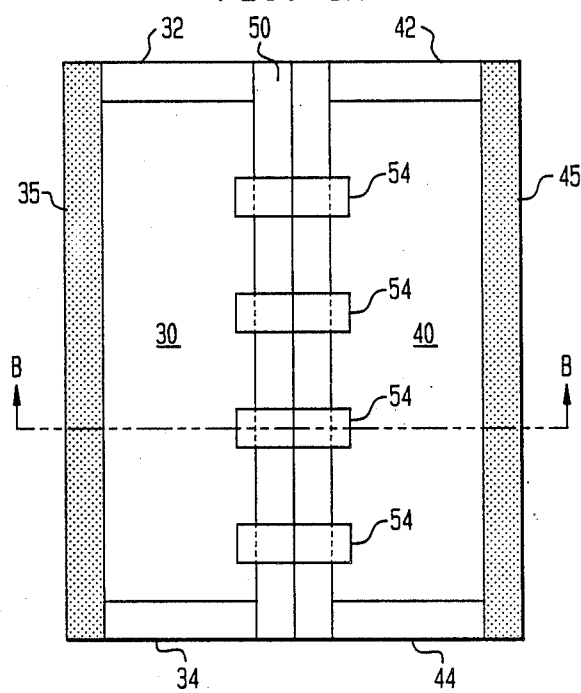
FIG. 3A is a top view of another illustrative embodiment of the invention including a pair of magnetodiodes useful in a differential sensor.
Figure 3B:
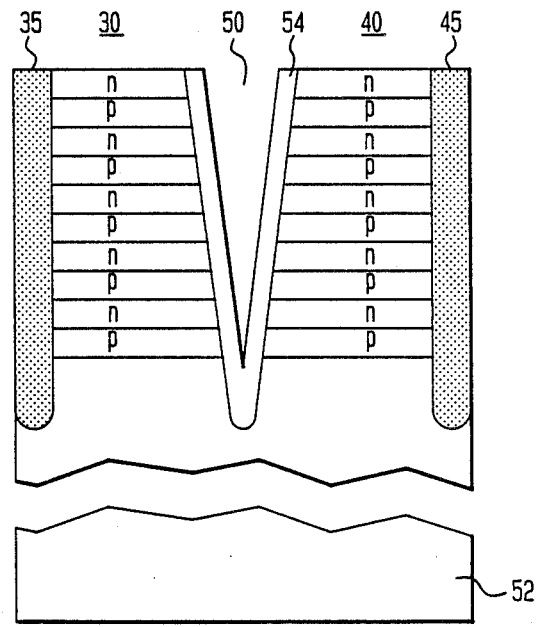
FIG. 3B is a cross section taken along the lines BB of FIG. 3A.

FIGS. 3A and 3B show this solution in an embodiment that also shows an integrated pair of magnetodiodes 30 and 40. Magnetodiodes 30 and 40 are electrically separated from one another by means of a V-shaped groove or trench 50. Each diode includes a doping superlattice essentially of the kind shown in FIG. 1. Each diode may be viewed as a layered mesa on a semi-insulating substrate 52. Typically, the structure may be formed by epitaxially growing the desired number of layers on the semi-insulating substrate and thereafter forming the trench 50 to divide the layers into two separate sets of layers that form two separate diode layers. Each of the two sets of layers is provided at its opposite ends with its own discrete n-type electrode 32, 42, analogous to electrode 18 and a p-type electrode 34, 44, analogous to electrode 19.

A series of separate regions 54 of short carrier recombination times, as seen in FIG. 3A, is provided along the walls of the trench 50. Typically, these can be formed by providing an appropriately apertured mask along the trench and then selectively damaging the unmasked regions (as by unannealed ion implantation) to form the desired short recombination time regions 54. By keeping such regions 54 spaced apart, there is avoided the problem previously discussed of forming a shorting conductive layer. Moreover, as indicated by the stippling, the outer surfaces 35 and 45 of diodes 30 and 40, respectively, may be treated to be surfaces of relatively long recombination times, in the manner previously discussed for the back surface 26 in the embodiment of FIG. 2.

Because regions 54 are separate, it is feasible to use a wider variety of techniques for shortening the carrier recombination times therein, such as providing ohmic contacts, typically by the deposition of metals suitable for that purpose. In the case of gallium arsenide, suitable metals include AuGeNi alloys, palladium, indium and platinum. In such instances, the structure is heated during or after metal deposition to melt the metal to form damaged surface regions with very short carrier recombination times.

It can be appreciated that the two diodes 30 and 40 will operate in opposite senses since an applied magnetic field of a direction to deflect the carriers in diode 30 towards the trench 50 will in diode 40 deflect such carriers towards the outer edge 45 of high recombination times rather than towards the trench 50. Conversely, an applied magnetic field of a direction to deflect the carriers in diode 40 towards the trench 50 will result in diode 30 in a deflection toward its outer edge 35 of high recombination times. Such a pair of magnetodiodes is especially useful in differential sensors where the two magnetodiodes are supplemented by two additional fixed resistors to form the four branches of a conventional bridge. Such differential arrangements are able to provide sensors with improved tolerance to temperature and power supply variations.

It is to be understood that the specific embodiments described are merely illustrative of the general principles of the invention and various modifications will be possible without departing from the spirit and scope of the invention.

Firstly, while the invention will be of particular interest with use of direct band-gap materials where the improvement in recombination items will be greatest, it is also of interest with indirect gap materials such as silicon and germanium. Such materials in certain applications may be preferred for other reasons, such as lower cost or greater compatibility with other parts of the system in which the sensors are to be used.

Also, the long recombination times contemplated in the foregoing discussion are of the order of at least about 1 microsecond, generally about 100 microseconds to 1 second, and more. The short recombination times contemplated herein, as for example to be used in regions 24 and 54, are of the order of about 1–100 nanoseconds. As for mobility, when we refer to high mobility, we mean a mobility of about 8,000–80,000 $cm^2 volt^{-1} sec^{-1}$. By low mobility we mean a mobility of the order of 500–1,500 $cm^2 volts^{-1} sec^{-1}$ or less. While we do not have considerable test data to support the following thought, we believe that the ratio of high-to-low recombination times in this invention should be at least 10:1 and preferably about 100:1 and higher. On the other hand, it is conceivable that in certain circumstances the advantages of this invention might be achieved with a recombination time ratio of only 5:1.

Additionally, various other techniques may be used for forming localized short recombination time regions or long recombination time regions. In the embodiments described the magnetic field being tested is used for deflecting carriers normally flowing in long recombination time regions into short recombination time regions in order to decrease the output current with the increased magnetic field in the appropriate direction. Alternatively, structures may be devised in which the carriers normally flow in short recombination time regions and the magnetic field to be sensed is made to divert such flow into long recombination time regions, whereby the output current increases with increasing magnetic field in the appropriate direction.

Additionally, there may be devised a variety of circuit arrangements for association with the magnetodiodes of the invention for achieving particular results including the use of various bridge arrangements for achieving higher sensitivities.

Moreover, a variety of other geometries are feasible for the short and long carrier recombination time regions, some of which are described in our copending application Ser. No. 181,758, filed Apr. 14, 1988 now U.S. Pat. No. 4,843,444. Additionally, while the invention has been described with particular reference to magnetodiodes, the principles involved are also applicable to magnetoresistors and to magnetotransistors.

The embodiments of the invention in which an exclusive property or privilege is claimed are defined as follows:

1. A magnetic field sensor comprising a semiconductive crystalline element that includes at least one region of long carrier recombination times adjacent at least one region of short carrier recombination times for deflection of carriers between the regions of short and long carrier recombination times by a magnetic field to be sensed, wherein the improvement is that the semiconductive element comprises a doping superlattice of a plurality of layers formed by an n-i-p-i superstructure of a semiconductive material of a relatively short carrier recombination time in bulk but of a high mobility, and each layer has a thickness less than the Debye length of charge carriers in such layer.

2. A magnetic field sensor comprising a semiconductive crystalline element that includes at least one region of long carrier recombination times adjacent at least one region of short carrier recombination times for deflection of carriers between the regions of short and long carrier recombination times by a magnetic field to be sensed, wherein the improvement is that the semiconductive element comprises a doping superlattice of a plurality of layers formed by an n-i-p-i superstructure of a semiconductive material of a relatively short carrier recombination time in bulk but of a high mobility, and in which the semiconductive element is of a direct band gap semiconductor, such as gallium arsenide, the superlattice includes at least ten layers, and the thickness of each layer is less than the Debye length of charge carriers in such layer.

3. The magnetic sensor of claim 2 in which the average concentration of dopants in each of the layers is between $10^{16}$ and $10^{18}$ per cubic centimeter and the thickness of each layer is between 50 and 3,000 Angstroms.

4. A magnetic field sensor comprising a semiconductive crystalline element that includes at least one region of long carrier recombination times adjacent at least one region of short carrier recombination times for deflection of carriers between the regions of short and long carrier recombination times by a magnetic field to be sensed, wherein the improvement is that the semiconductive element comprises a doping superlattice of a plurality of layers formed by an n-i-p-i superstructure of a semiconductive material of a relatively short carrier recombination time in bulk but of a high mobility, and in which the semiconductive element includes a trench extending transversely through the layers along the length of the element for forming a pair of separate superlattices, separate injecting contacts are included at opposite ends of each superlattice of the pair of superlattices, and discontinuous regions of short carrier recombination times are disposed along the trench.

5. The magnetic sensor of claim 4 in which the surfaces of the superlattices opposite the walls of the trench are continuous semi-insulating regions of long carrier recombination times.

6. A magnetodiode comprising a semiconductive element of a semiconductive material of a relatively short carrier recombination time in bulk but of high mobility having an n-i-p-i doping superlattice of a plurality of planar parallel layers in which each layer has a thickness less than the Debye length of charge carriers in such layer, contiguous layers being of opposite conductivity types, each layer including regions of short and long carrier recombination times, an n-type injecting contact and a p-type injecting contact at opposite ends of said layers in the element, each in contact with all of the layers but in blocking contact with different alternate layers for passing current through the layers and p/n junctions between said layers, the regions of short and long recombination times being positioned along the length of said layers so that current flowing in one of the two regions is transversely deflected to the other of the two regions by the component of magnetic flux passing through the element normal to the layers.

7. A magnetodiode in accordance with claim 6 in which the semiconductive element includes between 10 and 100 layers, each of a thickness between 50 and 3,000 Angstroms, and having an average doping concentration between about $10^{16}$ and $10^{18}$ ions per cubic centimeter.

8. A magnetodiode in accordance with claim 7 in which the element is of a compound semiconductor taken from the group consisting of gallium arsenide, indium antimonide, indium arsenide and bismuth-antimony alloys.

* * * * *